United States Patent [19]

Kato et al.

[11] Patent Number: 5,102,009

[45] Date of Patent: Apr. 7, 1992

[54] SMALL-ARTICLE FEED MACHINE

[75] Inventors: Katsuo Kato, Hiratsuka; Shichisei Tani, Yokohama; Takayoshi Sagawa, Hiratsuka, all of Japan

[73] Assignee: Japan Tobacco Inc., Tokyo, Japan

[21] Appl. No.: 640,359

[22] PCT Filed: Jun. 16, 1990

[86] PCT No.: PCT/JP90/00789

§ 371 Date: Jan. 23, 1991

§ 102(e) Date: Jan. 23, 1991

[87] PCT Pub. No.: WO90/15765

PCT Pub. Date: Dec. 27, 1990

[30] Foreign Application Priority Data

Jun. 16, 1989 [JP] Japan .................. 1-152256

[51] Int. Cl.⁵ .............................................. B23Q 7/00
[52] U.S. Cl. .................................. 221/68; 198/400; 198/418.6; 221/172; 221/296
[58] Field of Search ............... 198/400, 418.6, 418.1; 221/68, 171-173, 296

[56] References Cited

U.S. PATENT DOCUMENTS

| | | | |
|---|---|---|---|
| 1,325,752 | 12/1919 | Pope | 221/68 |
| 3,526,743 | 9/1970 | Spisak | 221/68 |
| 4,362,234 | 12/1982 | McDonald et al. | 198/400 |
| 4,427,131 | 1/1984 | Facchini | 198/400 |
| 4,718,319 | 1/1988 | Bajohr et al. | 221/172 |
| 4,828,142 | 5/1989 | McKnight | 221/173 |

FOREIGN PATENT DOCUMENTS

| | | | |
|---|---|---|---|
| 2031031 | 1/1971 | Fed. Rep. of Germany . | |
| 2340246 | 9/1977 | France . | |
| 30-1149 | 2/1955 | Japan . | |
| 42-22109 | 10/1967 | Japan . | |
| 45-23376 | 8/1970 | Japan . | |
| 49-115664 | 5/1974 | Japan . | |
| 51-32208 | 8/1976 | Japan . | |
| 55-48527 | 12/1980 | Japan . | |
| 57-52290 | 11/1982 | Japan . | |
| 60-197513 | 10/1985 | Japan . | |
| 61-257817 | 11/1986 | Japan . | |
| 576559 | 9/1942 | United Kingdom | 221/68 |
| 599845 | 3/1948 | United Kingdom . | |

*Primary Examiner*—H. Grant Skaggs
*Attorney, Agent, or Firm*—Birch, Stewart, Kolasch & Birch

[57] ABSTRACT

An apparatus of this invention has a parts feeder unit, and this parts feeder unit has a plurality of parts feed countries. Guide pipe paths are respectively connected to these parts feed ports. Aligning units are arranged midway along these guide pipe paths, respectively. All small articles are aligned by these aligning units in the same direction. Outlet heads are arranged at lower end portions of the guide pipe paths, respectively. An aligning plate and a matrix plate are arranged below these outlet heads. The small articles fed from the outlet head are stored in the matrix plate in a matrix form within the matrix plate in an aligned state. These small articles are stored in the matrix plate by a drop pleich. These small articles are held in this matrix plate by the drop plate. Upon movement of the drop plate in the horizontal direction, these small articles drop and are respectively stored in storage holes of a tray.

2 Claims, 7 Drawing Sheets

SMALL-ARTICLE FEED MACHINE

TECHNICAL FIELD

The present invention relates to a small-article feed machine for feeding small articles having two ends of different shapes in a predetermined arrangement, the small articles being exemplified as compact cylindrical containers which are aligned in their axial direction and each of which has one open end and the other closed end.

BACKGROUND ART

One of the small articles is exemplified as a compact cylindrical container having one open end and the other closed end. Such a cylindrical container is widely used as a container for storing a liquid which is consumed in a very small amount at a time. In order to inject a predetermined amount of liquid into such a cylindrical container, a predetermined number of containers rather than individual containers are preferably dealt as a unit. For this purpose, the cylindrical containers are dealt such that a predetermined number of cylindrical containers are held on a tray. This tray has holes for storing the individual cylindrical containers in a matrix form.

In order to store the cylindrical containers into the corresponding storage holes formed in the tray, the directions of the cylindrical containers fed from a parts feeder must be aligned with each other. That is, some cylindrical containers are fed from the parts feeder such that their open ends are leading ends. Other cylindrical containers are fed from the parts feeder such that their closed ends are leading ends. In order to inject the liquid into the cylindrical containers, the individual containers must be fed toward a tray such that the closed ends are leading ends. For this reason, the cylindrical containers from the parts feeder must be supplied to an appropriate aligning unit, the axial directions of the individual containers are detected in the aligning unit, and all the containers are aligned such that their closed ends are leading ends.

The cylindrical containers having passed through the aligning unit are then stored in the holes formed in the tray. In this case, the cylindrical containers are generally stored in the corresponding storage holes one by one or in units of rows in a conventional arrangement. That is, the cylindrical containers whose axial directions are aligned with each other are fed from the aligning unit and are transferred through a guide pipe path. When the cylindrical containers are to be transferred from the guide pipe path to the holes formed in the tray, it is impossible to continuously feed the cylindrical containers to the tray by simply guiding the lower end of the guide pipe path to each storage hole of the tray. More specifically, since the cylindrical containers continue within the guide pipe path, in order to pick up each cylindrical container and feed it into a predetermined storage hole, a complicated transfer mechanism is required In addition, since the transfer mechanism is located above the tray, it is impossible to simultaneously feed the cylindrical containers into all the storage holes of the tray. Cylindrical containers can be simultaneously fed to only the storage holes of each row. In the above feeding of the cylindrical containers, the tray must be intermittently conveyed to every row of the cylindrical containers, thereby complicating a tray conveyance mechanism.

The present invention has been made in consideration of the above situation, and has as its object to provide a compact small-article feed machine which can feed small articles having an aligned axial direction in an aligned state and which has a simple structure.

DISCLOSURE OF THE INVENTION

A small-article feed machine according to the present invention comprises a parts feeder unit which stores small articles each having two ends of different shapes. The parts feeder unit has a predetermined number of parts feed ports capable of sequentially feeding out small articles while an axial direction of small articles is aligned with their feed direction.

One end of each of the guide pipe paths is connected to a corresponding one of the parts feed ports of the parts feeder. These guide pipe paths receive, transfer, and guide the small articles fed out from the corresponding parts feed ports without changing their postures.

An aligning unit is arranged midway along each guide pipe path. The aligning unit has a function of detecting directions of the small articles on the basis of their end shapes, and guiding each small article to a downstream portion of the corresponding guide pipe path with its one end leading when the small articles are sequentially transferred from the parts feeder along the corresponding guide pipe path.

A feed head is arranged in the lower end portion of each guide pipe path. This feed head has a feed path corresponding to each guide pipe path. These feed paths are equidistantly arranged in the horizontal direction. An opening at one end of each feed path is connected to the lower end of the corresponding guide pipe path and receives a small article. The feed path feeds out the small article from an opening at its other end.

In the feed head, an aligning plate is arranged at the opening of the other end of each feed path. This aligning plate has a plurality of reception grooves corresponding to the feed paths. These reception grooves extend parallel to each other so as to coaxially continue with the other-end openings of the corresponding feed paths. Each groove has a length enough to receive a predetermined number of small particles continuously aligned in a line.

A feed stop unit is arranged in the feed head to stop feeding the small particles from the corresponding inlet path of the feed head when a predetermined number of small articles are received within the groove of the aligning plate.

A matrix plate is horizontally arranged immediately below the aligning plate. This matrix plate has drop openings corresponding to the small articles of the aligning grooves in a matrix form. Each small article in an upright posture can pass through each drop opening.

The bottom wall of each aligning groove in the aligning plate is constituted by a drop plate. The drop plate is horizontally movable in the direction of aligning grooves and the feed head. The drop plate is movable by a drop plate drive mechanism between a holding position on the matrix plate and a drop position shifted from the matrix plate.

In the small-article feed/aligning machine, a predetermined amount of small articles are sequentially fed to the corresponding aligning groove of the aligning plate from each feed path of the feed head while the drop plate is held in the holding position, i.e., in a state wherein the drop plate is aligned with the matrix plate.

The axial directions of the small articles to be fed to the aligning groove are already aligned by the aligning unit. All the small articles within each aligning groove are aligned so that one end of each small article is aligned in a direction opposite to the feed head.

When the drop plate is moved to the drop position by the feed stop unit while feeding of the small articles from the feed head is stopped, the small articles within each aligning groove drop through the corresponding drop openings of the matrix plate. In this case, since the drop plate is horizontally moved from the holding position in the direction of aligning grooves and the feed head as described above, the small articles within each aligning groove drop through the corresponding drop openings so that one end of each small article serves as a leading end. When the tray described above is arranged below the matrix plate, the small articles can be almost simultaneously fed in the corresponding storage holes of the tray. In this case, the storage holes of the tray are formed in the same matrix form as that of the drop openings of the matrix plate, as a matter of course.

BRIEF DESCRIPTION OF DRAWINGS

The drawings show an embodiment of the present invention, in which.

BEST MODE OF CARRYING OUT THE INVENTION

An embodiment of the present invention will be described with reference to the accompanying drawings.

Figures 1, 2:
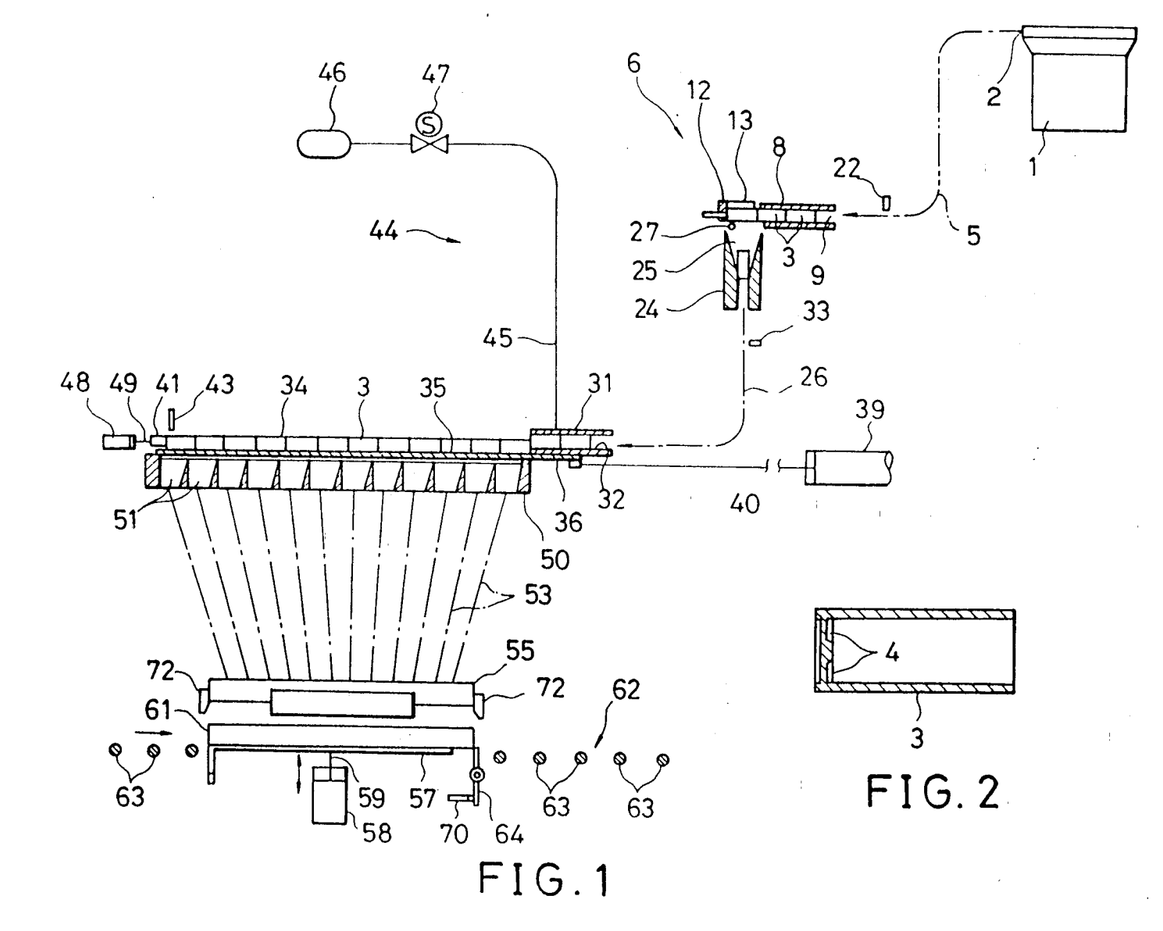
FIG. 1 is a schematic view of an overall arrangement of a feed machine.
FIG. 2 is a sectional view of a capsule.

FIG. 1 schematically illustrates the overall arrangement of a small-article feed machine. This feed machine comprises a parts feeder unit 1. The parts feeder unit 1 comprises a single parts feeder or a plurality of parts feeders. The parts feeder unit 1 has, e.g., 12 parts feed ports 2. Note that only one parts feed port 2 is illustrated in FIG. 1. The parts feeder unit stores a large number of small articles each having two ends of different shapes, e.g., capsules 3 shown in FIG. 2 in this embodiment.

The capsule 3 will be described below. The capsule 3 comprises a small cylindrical container made of a synthetic resin and having one closed end and the other open end. The closed end of the capsule 3 has a thin-walled portion which can open the closed end when its outer end wall is pushed by a finger to elastically deform the outer end wall. In this embodiment, the thin-walled portion comprises a plurality of radial grooves 4.

The parts feeder unit 1 has a function of sequentially feeding the capsules 3 from each parts feed port 2. In this case, the capsules 3 are fed from the parts feed port 2 such that the axial direction of the capsule 3 is aligned with its feed direction.

One end of a first guide pipe path 5 indicated by the alternate long and short dashed line in FIG. 1 is connected to each parts feed port 2 of the parts feeder unit 1. The other end of the first guide pipe path 5 is connected to an aligning unit 6. The aligning unit 6 is located below the parts feeder unit 1. The capsule 3 fed out from each parts feed port 2 of the parts feeder unit 1 is guided to the aligning unit 6 through the first guide pipe path 5. In this case, the capsule 3 guided to the aligning unit 6 through the first guide pipe path 5 maintains its posture so that the closed or open end serves as a leading end.

Figure 3:
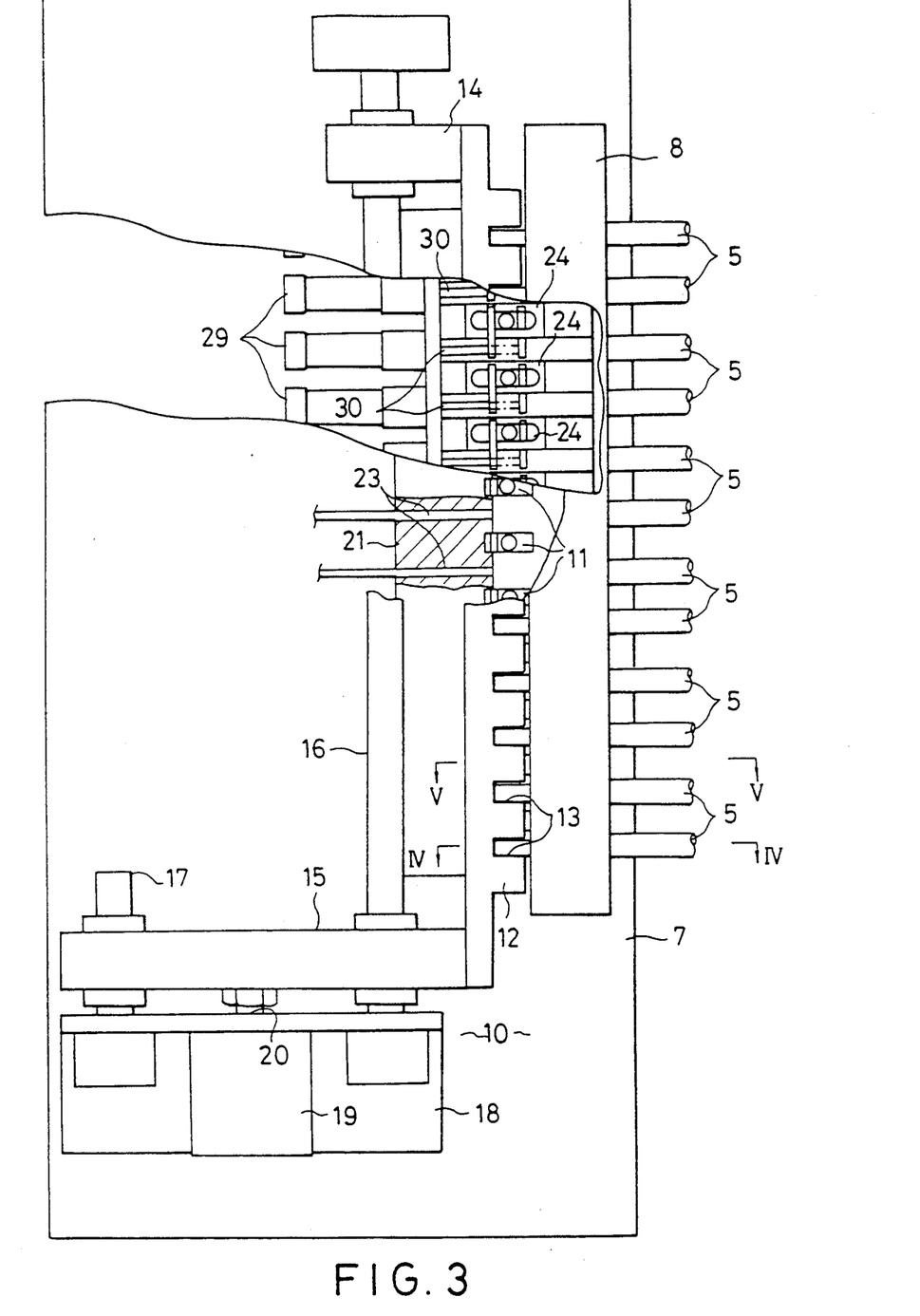
FIG. 3 is a partially cutaway plan view of an aligning unit.
Figure 4:
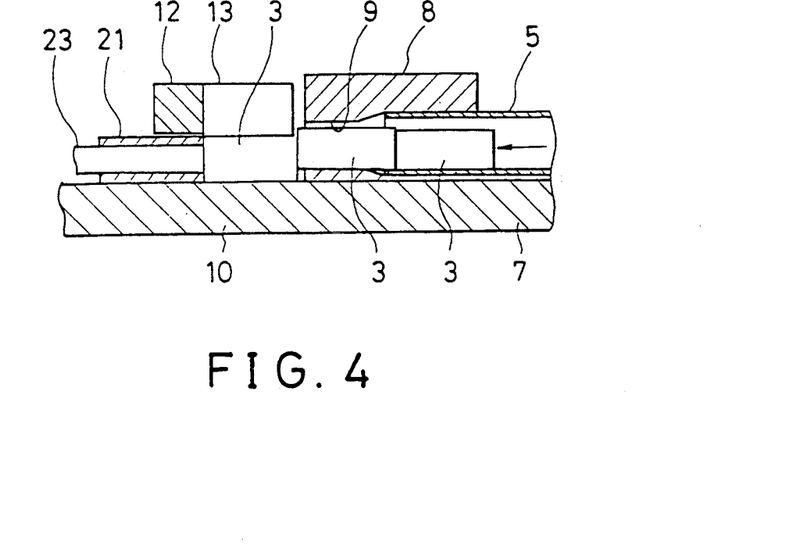
FIG. 4 is a sectional view of the aligning unit along the line IV—IV of FIG. 3.
Figure 5:
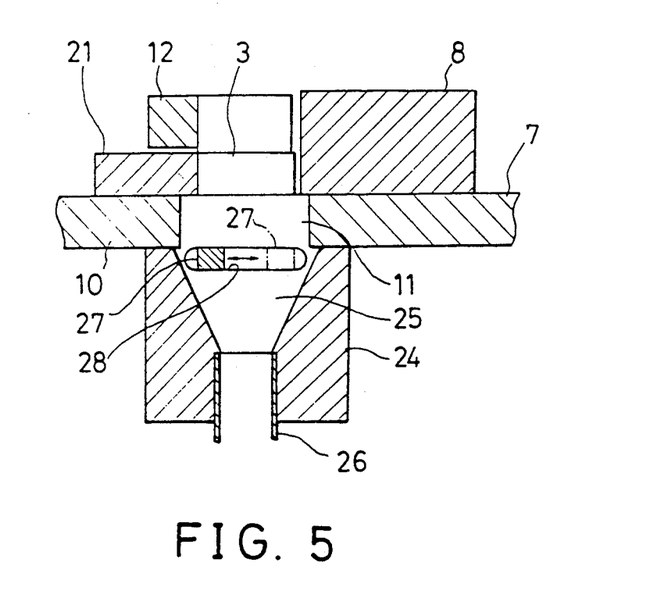
FIG. 5 is a sectional view of the aligning unit along the line V—V of FIG. 3.

The aligning unit 6 is best illustrated in FIGS. 3 to 5 and will be described below. As is apparent from FIG. 3, the aligning unit 6 comprises a rectangular base plate 7 aligned in the horizontal direction. An inlet head 8 is disposed on the base plate 7. The inlet head 8 comprises a rectangular block member. The inlet head 8 has inlet paths 9, the number of which is equal to that of the first guide pipe path 5, i.e., 12 inlet paths 9. These inlet paths 9 are equidistantly arranged in the horizontal direction. Two ends of each inlet path 9 are open to corresponding two side surfaces of the inlet head 8. The other end of each first guide pipe path 5 is inserted into and connected to one end of the corresponding inlet path 9 on the parts feeder apparatus 1 side.

A portion of the base plate 7 on the other-end side of the inlet path 9 constitutes an aligning plate 10. The aligning plate 10 has 12 passage openings 11 located at a position adjacent to the side surface of the inlet head 8, as shown in FIGS. 3 and 5. Only three passage openings 11 are illustrated in FIG. 3, and only one passage opening 11 is illustrated in FIG. 5. Although these passage openings 11 are equidistantly aligned in the direction of an array of the inlet paths 9 of the inlet head 8, they are offset from the inlet paths 9 in the direction of the array of these inlet paths 9. In this embodiment, the passage openings 11 are offset from the inlet paths 9 by ½ pitches in the direction of the array of the inlet paths 9. Each passage opening 11 has a rectangular shape and a size enough to cause one capsule 3 aligned in the horizontal direction to pass therethrough.

A slide head 12 is slidably arranged adjacent to the inlet head 8 on the aligning plate 10 so as to cover the passage openings 11. The slide head 12 comprises an elongated block member expanding along the inlet head 8. The slide head 12 has 12 pockets 13 spaced apart from each other by a predetermined pitch in the same manner as the inlet paths 9 of the inlet head 8. These pockets 13 are constituted by rectangular notches open to the upper surface of the slide head 12 and the side surface of the inlet head 8. Each pocket 13 has a size enough to receive one capsule 3.

Two end portions of the slide head 12 are mounted through arms 14 and 15 on a guide rod 16 extending parallel to the slide head 12. The slide head 12 is slidable along the guide rod 16. The arm 15 extends over the guide rod 16, and its distal end portion is slidably supported by a cantilevered guide rod 17.

An air cylinder 19 constituting a slide head drive mechanism is mounted on a support base 18 which supports one end of each of the guide rods 16 and 17. A piston rod 20 of the air cylinder 19 is connected to the central portion of the arm 15. When the piston rod of the air cylinder 19 is driven, the slide head 12 is reciprocated along the inlet head 8, so that each pocket 13 can be moved to a reception position where it is aligned with the corresponding inlet path 9 of the inlet head 8 or a discharge position where it is aligned with the passage opening 11.

A stopper plate 21 extending along the slide head 12 is fixed on the aligning plate 10. As is apparent from FIGS. 4 and 5, one edge of the stopper plate 21 is inserted into the slide head 12, so that one side surface of the stopper plate 21 constitutes part of the inner end face of the pocket 13 in the slide head 12. When the slide head 12 is moved to the reception position described above, the leading capsule 3 fed by a push-push technique from the parts feeder unit 1 to each inlet path 9 of the inlet head 8 through the corresponding first guide path 5 is fed from the corresponding inlet path 9 to the corresponding pocket 13 of the slide head 12 and abuts against the stopper plate 21.

As schematically illustrated in FIG. 1, a detector 22 for detecting the presence/absence of the capsule 3 in the guide pipe path 5 is arranged midway along each first guide pipe path 5. The detector 22 outputs a detection signal for stopping the operation of the slide head 12 when capsules 3 are absent from the first guide pipe path 5. That is, when this detection signal is output, the slide head 12 is moved to the discharge position, and its operation is stopped. Then, feeding of the capsule 3 from each inlet path 9 of the inlet head 8 to each pocket 13 of the slide head 12 is stopped.

Twelve detectors 23 are arranged on one side of the stopper plate 21. The detectors 23 are exposed in the corresponding pockets 13 of the slide head 12 so as to oppose the corresponding inlet paths 9 of the inlet head 8. Each detector 23 comprises a discrimination sensor consisting of a light-emitting element and a light-receiving element. When the slide head 12 is located at the reception position and the capsule 3 is received into the pocket 13 of the slide head 12, the detector 23 detects the axial direction of this capsule 3 and outputs a discrimination signal. That is, when the closed end of the capsule 3 in the pocket 13 opposes one side surface of the stopper plate 21, the detector 23 outputs a first discrimination signal. When the open end of the capsule opposes one side surface of the stopper plate 21, the detector 23 outputs a second discrimination signal.

As shown in FIG. 5, reception members 24 are arranged immediately below the corresponding passage openings 11 of the aligning plate 10. Reception holes 25 tapered toward their distal ends are formed in the reception members 24 in continuation with the corresponding passage openings 11. In this embodiment, each reception hole 25 is a rectangular hole having a major axis aligned with that of the passage opening 11, as is apparent from FIG. 3. At the same time, each reception hole 25 has two arcuated end portions, and the upper portion of the reception hole 25 is slightly larger than the passage opening 11. Second guide pipe paths 26 similar to the first guide pipe paths 5 are connected to the reception holes 25 of the reception members 24, respectively.

In this embodiment, pins 27 are fitted in the upper portions of the reception holes 25 of the reception members 24. Each pin 27 horizontally extends along the minor-axis direction of the reception holes 25. Two ends of the pin 27 are slidably inserted into slots 28 of the corresponding reception member 24. These slots 28 horizontally extend along the major-axis direction of the reception holes, so that the pin 27 can be moved in the major-axis direction of the reception hole 25.

The pins 27 can be independently moved by air cylinders 29 constituting pin drive mechanisms in the major-axis direction of the reception holes 25. As is apparent from FIG. 3, one end of the pin 27 extends from the corresponding reception member 24. An extended end of the pin 27 is connected to a piston rod 30 of the corresponding air cylinder 29 paired with this piston rod 30. Each air cylinder 29 is operated in response to a discrimination signal from each detector 23. In this embodiment, when the capsule 3 is fed to one pocket 13 and the detector 23 of this pocket 13 outputs the first discrimination signal, the pin 27 in the reception member 24 paired with this pocket 13 is moved to a position indicated by the alternate long and short dashed line in FIG. 5. On the other hand, when the second discrimination signal is output, the pin 27 is moved by the corresponding air cylinder 29 to a position indicated by the solid line.

Each pin 27 is positioned in accordance with the axial direction of the capsule 3 fed to each pocket 13. When positioning of each pin 27 is performed and then the slide head 12 is switched by the air cylinder 19 from the reception position to the discharge position, each pocket 13 of the slide head 12, which pocket 13 holds the capsule 3 is moved to a position where it is aligned with the corresponding passage opening 11 of the aligning plate 10. The capsule 3 of each pocket 13 drops from the pocket 13 into the reception hole 25 of the corresponding reception member 24 through the passage opening 11. In this case, the capsule 3 drops into the reception hole 25 while maintaining its horizontal posture. As is apparent from the switching position of the pin 27 in this embodiment, one end portion of each capsule, i.e., its open end abuts against the pin 27 upon dropping. The open ends of all the capsules 3 which are going to drop in the reception holes 25 of the reception members 24 abut against the pins 27. The capsules 3 therefore drop with the closed ends facing down, and are guided into the corresponding second guide pipe paths 26. Thereafter, the slide head 12 returns to the reception position, and a new capsule 3 is supplied from the inlet head 8 to each pocket 13. The above operations are then repeated All the capsules 3 supplied to the second guide pipe paths 26 are guided through the second guide paths 26 with the closed ends leading.

An outlet head 31 is horizontally arranged below the aligning unit 6. As is apparent from FIG. 6, the outlet head 31 has the same shape and structure as those of the inlet head 8. In this case, the outlet head 31 has 12 outlet paths 32 in place of the inlet paths 9. The outlet paths 32 are equidistantly arranged in the horizontal direction. One end of each outlet path 32 is inserted into and connected to the lower end of the corresponding second guide pipe path 26. The capsule 3 guided through each second guide pipe path 26 by the pushpush technique is guided to the corresponding outlet path 32 of the outlet head 31 and can be fed out from the other end of this outlet path 32. A detector 33 similar to the detector 22 is arranged midway along each second guide pipe path 26.

Figure 7:
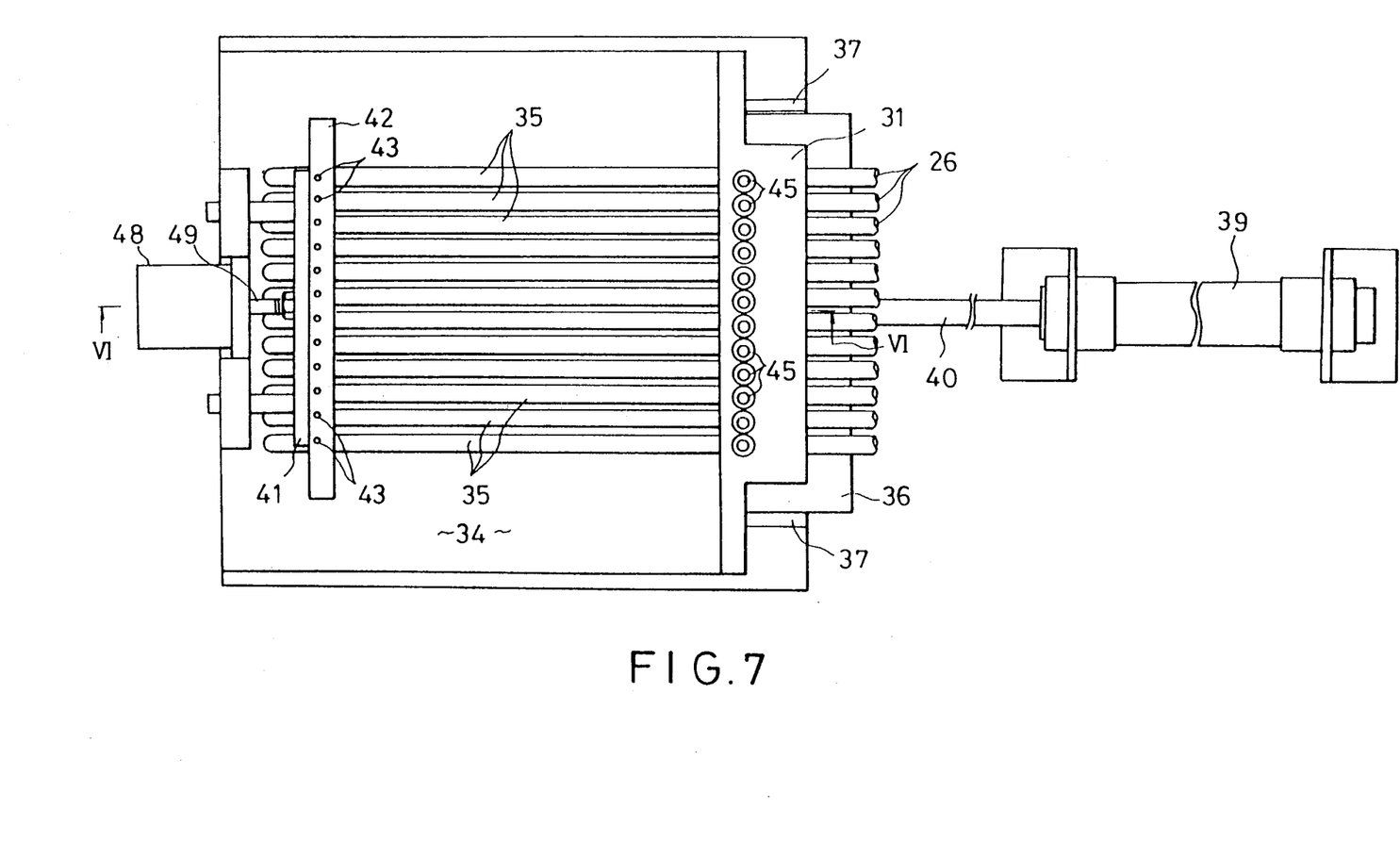
FIG. 7 is a plan view of an aligning plate.

An aligning plate 34 is horizontally arranged adjacent to the outlet head 31 on the other-end side of the outlet path 32 in the outlet head 31. As is apparent from FIG. 7, the aligning plate 34 has an almost square shape and has 12 reception grooves 35. These reception grooves 35 are bottomless notched grooves and correspond to the 12 outlet paths 32 of the outlet head 31. The reception grooves 35 are parallel to each other and are spaced apart from the side surface of the outlet head 31 at the aligning plate 34.

A drop plate 36 is arranged immediately below the aligning plate 34. The drop plate 36 constitutes a bottom wall of the reception grooves 35 and is held to be slidable in a direction indicated by an arrow A in FIG. 6. That is, as is apparent from FIG. 8, a pair of guide plates 37 each having an L-shaped section are arranged on both sides of the plate 36 in the direction indicated by the arrow A. Guide rollers 38 for guiding the drop plate 36 in the direction indicated by the arrow A are rotatably mounted on the inner surfaces of these guide plates 37.

Figure 6:
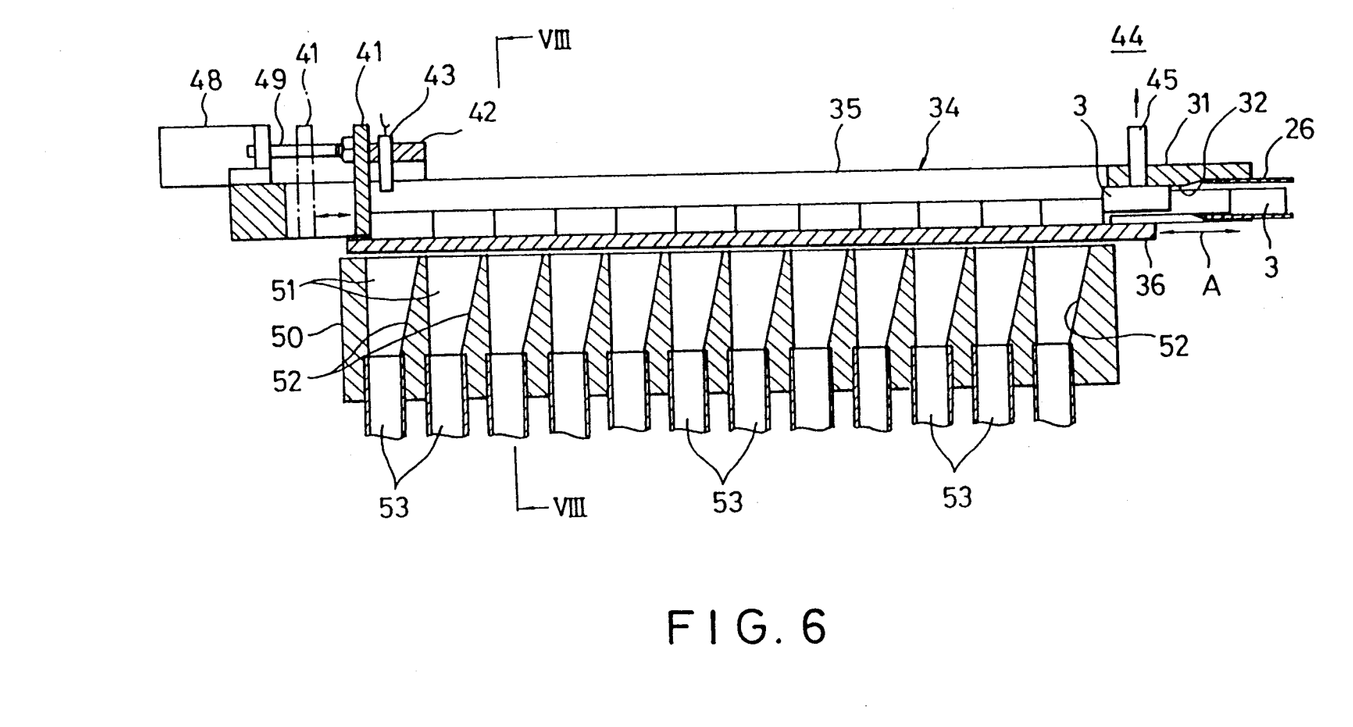
FIG. 6 is a sectional view taken along the line VI—VI in FIG. 7.

A piston rod 40 of an air cylinder 39 constituting a drop plate drive mechanism is connected to an edge of the drop plate 36 on the outlet head 31 side. When the air cylinder 39 is driven, the drop plate 36 is moved between a holding position where it serves as the bottom wall of the reception grooves 35 in the aligning plate 34 and a drop position where the drop plate 36 is shifted from the reception grooves 35.

When the drop plate 36 is located at the holding position, the capsules 3 discharged from each outlet path 32 of the outlet head 31 are sequentially supplied to the corresponding reception groove 35 of the aligning plate 34 in an array.

Figure 8:
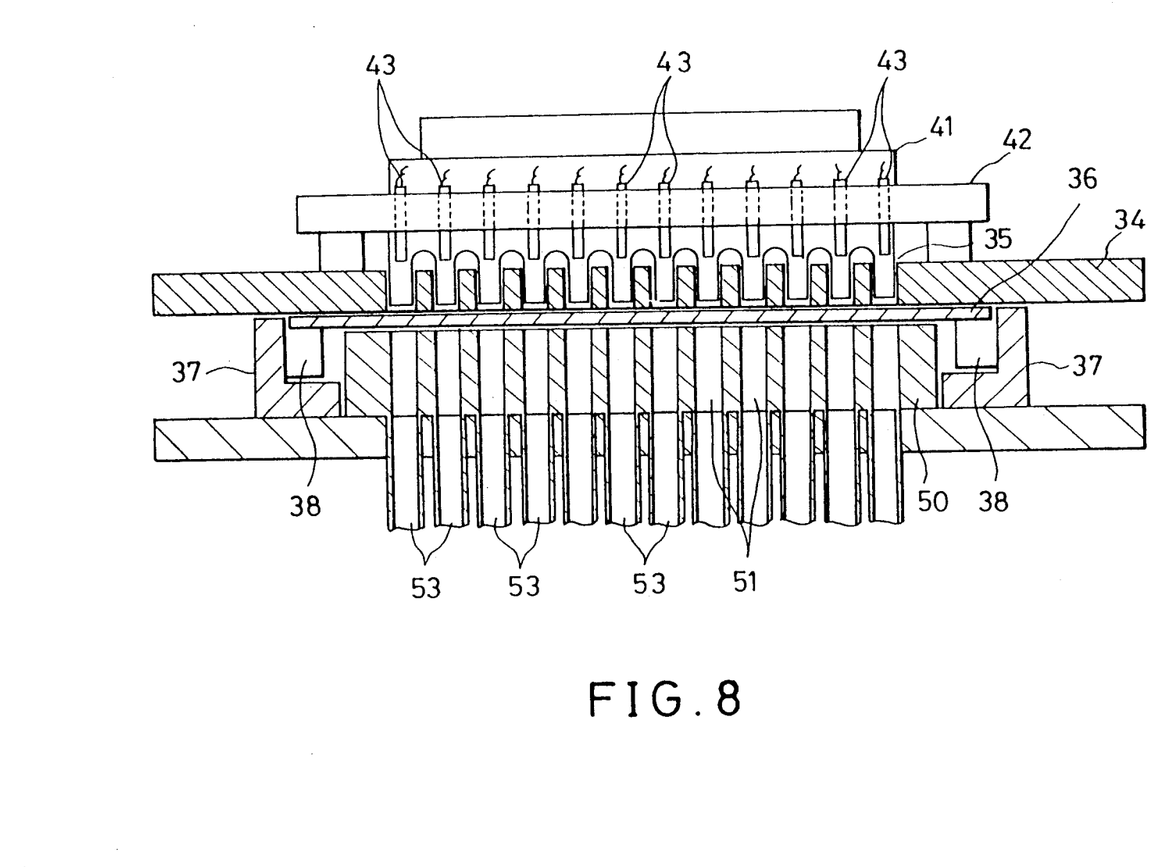
FIG. 8 is a sectional view of the aligning plate along the line VIII—VIII of FIG. 6.

A stopper 41 is arranged on the inner wall side of the reception groove 35 in the aligning plate 34. As shown in FIG. 8, this stopper 41 comprises a plate member having a comb-like lower surface. The teeth of the stopper 41 are respectively inserted in the reception grooves 35 so as to be meshed with them. The first capsule 3 inserted into the reception groove 35 is moved forward toward the stopper 41 since additional capsules 3 are subsequently fed to this reception groove 35. The first capsule 3 then abuts against the stopper 41. When the leading capsule 3 abuts against the stopper 41, the 12 capsules 3 are stored in each reception groove 35 in a line.

When the capsules 3 are aligned in each reception groove 35 in a line, a detector mounting member 42 (FIG. 6) which abuts against the stopper 41 is arranged to bridge over the twelve reception grooves 35. The detector mounting member 42 has a gate-like shape, and its two legs are supported on the aligning plate 34. A total of twelve detectors 43 are mounted on the detector mounting member 42 in correspondence with the reception grooves 35. These detectors 43 have the same arrangements as those of the detectors 22 and 33. Each detector 43 detects whether the capsule 3 is present immediately below the detector 43, i.e., whether the leading capsule 3 in the reception groove 35 abuts against the stopper 41. The detector 43 outputs its detection signal.

Each detector 43 prevents feeding of the capsules 3 into an abutment in which the leading capsule 3 is in contact with the stopper 41.

In addition, the stopper 41 is connected to a piston rod 49 of an air cylinder 48. Upon driving of the piston rod 49 of the air cylinder 48, the stopper 41 is movable in a direction to be separated from the detector mounting member 42.

As shown in FIGS. 6 and 8, a matrix plate 50 is arranged immediately below the drop plate 36 held in the holding position so as to be clamped between the pair of guide plates 37. The matrix plate 50 has a total of 144 drop openings 51 corresponding to the capsules 3 in the respective reception grooves 35. Each drop opening 51 has a rectangular shape enough to cause the capsule 3 to pass therethrough. The size of the drop opening 51 is gradually reduced downward. That is, as shown in FIG. 6, the inner end wall located on the outlet head 31 side in each drop opening 51 forms an inclined wall 52.

In this embodiment, each drop opening 51 of the matrix plate 50 is slightly shifted toward the stopper 41 in the direction of the reception grooves 35 with respect to the corresponding capsules 3 stored in the reception grooves 35.

Figure 9:
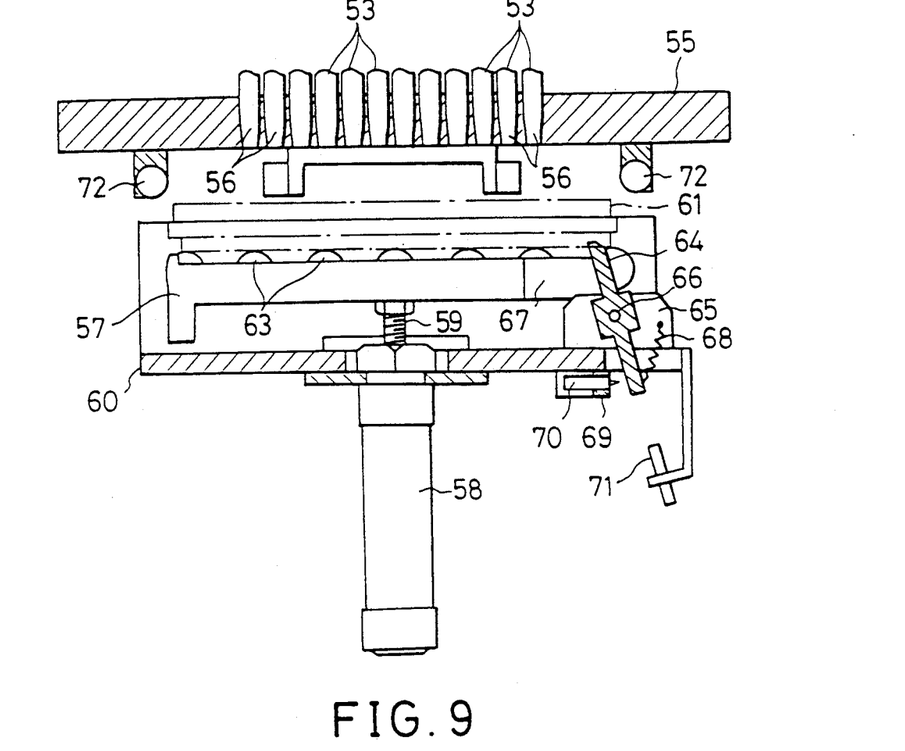
FIG. 9 is a sectional view of a loading unit.

The upper end of a drop pipe path 53 similar to the guide pipe paths 5 and 26 is connected to the lower end of each drop opening 51 in the matrix plate 50. As shown in FIG. 9, the lower end of each drop pipe path 53 is mounted on a loading plate 55 arranged in the horizontal direction That is, 144 through holes 56 arranged in a matrix form are formed in the loading plate 55. The lower end of each drop pipe path 53 is inserted into and connected to the upper portion of the corresponding through hole 56.

A loading unit for the capsules 3 is arranged below the loading plate 55. The loading unit has a lift 57. The lift 57 is connected to a piston rod 59 of a lift cylinder 58 consisting of an air cylinder. The lift 57 is vertically moved upon driving of the piston rod 59 of the lift cylinder 58. Reference numeral 60 in FIG. 9 denotes a support member for supporting the lift cylinder 58.

As schematically illustrated in FIG. 1, the lift 57 constitutes part of a conveyor 62 for conveying a tray 61. The conveyor 62 extends to pass below the loading plate 55. The lift 57 therefore has guide rollers 63 similar to the guide rollers constituting the conveyor 62. When the lift 57 is located at a lower position shown in FIG. 9, i.e., the lift 57 has the same level as that of the conveyor 62, the lift 57 constitutes part of the conveyor 62.

When the lift 57 is located at the lower position, as described above, the tray 61 conveyed along the conveyor 62 can be transferred onto the lift 57. When the tray 61 reaches the lift 57, conveyance of the tray 61 is stopped. That is, in order to appropriately transfer the tray 61 onto the lift 57, a stopper lever 64 is arranged at the leading edge of the lift 57 when viewed along the conveying direction of the tray 61. The central portion of the stopper lever 64 is pivotally mounted on a bracket 65 fixed on the support member 60. A coil spring 68 is hooked between the lower end of the stopper lever 64 and a bracket 65. When the lift 57 is located at the lower position, the upper end of the stopper lever 64 extends above the upper surface of the lift 57 through a notch 67 of the lift 57. A lock member 69 for abutting against the lower end of the stopper lever 64 and limiting clockwise pivotal movement of the stopper lever 64 is mounted on the support member 60. A detector 70 consisting of a limit switch is mounted on the lock member 69 to detect whether the stopper lever 64 abuts against the lock member 69. A detector 71 for detecting a pivotal position of the stopper lever 64 is mounted on the support member 60, as needed. The detector 71 is arranged to oppose the lower end of the stopper lever 64 and has a function of optically detecting the pivotal posture of the stopper lever 64, i.e., a function of optically detecting whether the stopper lever 64 is located at an angular position shown in FIG. 9.

In the loading unit having the arrangement described above, when the tray 61 is conveyed along the conveyor 62 and is then transferred onto the lift 57, the tray 61 is further moved on the lift 57 along the conveying direction. The tray 61 abuts against the upper end of the stopper lever 64 and pivots the stopper lever 64 clockwise. When the lower end of the stopper lever 64 abuts against an abutment member 69, pivotal movement of the stopper lever 64 is limited, and movement of the tray 61 on the lift 57 is stopped. The tray 61 is held on the lift 57. When abutment between the stopper lever 64 and the abutment member 69 is detected by the detector 70, conveyance of the next tray 61 along the conveyor 62 is stopped.

Figure 10:
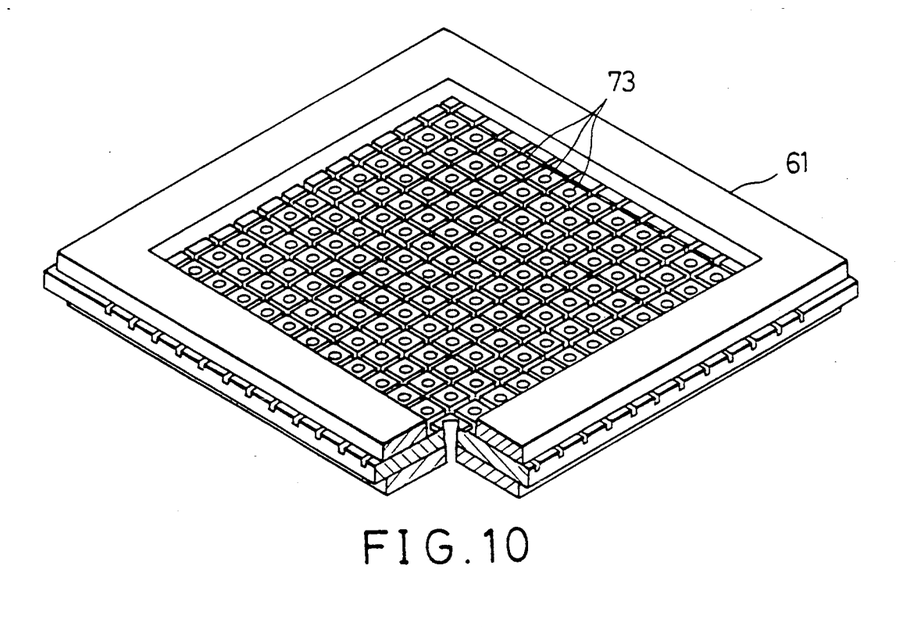
FIG. 10 is a perspective view of a tray.

When the lift cylinder 58 is driven the lift 57 is vertically moved together with the tray 61. The lift 57 is located immediately below the loading plate 55. In this case, engagement between the stopper lever 64 and the tray 61 is also released. When the lift 57 is located at the upper position, the pivotal posture of the stopper lever 64 is obtained by the behavior of the coil spring 68, as shown in FIG. 9. A guide 72 for guiding upward movement of the lift 57 is mounted on the lower surface of the loading plate 55. The tray 61 on the left 57 is accurately located at a predetermined position immediately below the loading plate 55 by this guide 72. That is, as is apparent from FIG. 10, 144 storage holes 73 capable of receiving the capsules 3 in an upright posture are formed in the tray 61 in the same matrix form as that of the through holes 56 formed in the loading plate 55. When the lift 57 is located the upper position, the storage holes 73 in the tray 61 are aligned with the corresponding through holes 56 in the loading plate 55. At this time, preparation for loading the capsules 3 on the tray 61 is completed.

Thereafter, the stopper plate 41 in the aligning capsule 34 is separated from the detector mounting member 42, as indicated by the alternate long and short, dashed line in FIG. 6, and then the air cylinder 39 is contracted. In this state, the drop plate 36 is moved to a position offset from the lower portion of the aligning plate 34. The capsules 3 already received in a line in the reception grooves 35 sequentially drop into the corresponding drop openings 50 of the matrix plate 50 from the leading capsules 3. The capsules are then loaded from the drop openings 50 to the corresponding storage holes 73 of the tray 61 through the drop pipe paths 53 and the through holes 56 of the loading plate 55.

Since the drop plate 36 is moved toward the outlet head 31, as previously described, all the capsules 3 which are about to drop from the reception grooves 35 toward the drop openings 51 of the matrix plate 50 drop from their ends opposite to the outlet head 31, i.e., the closed ends. Therefore, the capsules 3 finally loaded in the tray 61 are stored in the storage holes 73 so that their closed ends face down.

In the above embodiment, since the drop openings 51 in the matrix plate 50 are shifted from the capsules 3 in the reception grooves, even if the capsules 3 drop from the reception grooves while maintaining the horizontal postures, the open ends of the capsules 3 abut against the opening edges of the corresponding drop openings 51. Therefore, the capsules 3 can accurately drop so that their closed ends are leading ends when the capsules 3 pass through the corresponding drop openings 51.

When all the capsules 3 drop from the reception grooves 35 of the aligning plate 34, the drop plate 36 returns to the holding position. The stopper plate 41 also returns to a position where it abuts against the detector mounting member 42. Therefore, new capsules 3 are fed out from the outlet head 31 to the reception grooves 35 of the aligning plate 34, thereby aligning the capsules 3 in lines.

The tray 61 loaded with the capsules 3 is moved downward while the lift 57 is moved downward to the lower position. In this case, the tray 61 abuts against the upper end of the stopper lever 64 to pivot the stopper lever 64 counterclockwise. When the next empty tray 61 is fed toward the lift 57, the tray 61 on the lift 57 is not engaged with the stopper lever 64 and is pushed by an empty tray 61 in the downstream of the conveyor 62 from the lift 57. The next step is then started.

As described above, the empty tray 61 is moved by the lift 57 upward immediately below the loading plate 55. When the capsules 3 are aligned in lines in the reception grooves 35 of the aligning plate 34, the above operations are repeated to load the capsules 3 into the empty tray.

In addition, a predetermined liquid is filled in the capsules 3 loaded on the tray 61, and the open ends of the capsules are closed by seals (not shown) in a liquid-tight state.

INDUSTRIAL APPLICABILITY

In the small-article feed machine, as has been described above, when only the drop plate is arranged between the matrix plate and the aligning plate having the reception grooves, small articles in an aligned state can be fed to the next step. At the time of feeding of small articles in an aligned state, the movable member only the drop plate, and its structure can be simplified. In addition, its operation reliability can be improved. Feeding of small articles in an aligned state can be almost simultaneously performed, and feed efficiency of small articles can be improved, thus providing many advantages.

We claim:

1. A small-article feed machine characterized by comprising:

a parts feeder unit for storing small articles each having two ends of different shapes, said parts feeder unit being provided with a predetermined number of parts feed ports capable of sequentially feeding out the small articles while an axial direction of the small articles is aligned with a feed direction thereof, a plurality of guide pipe paths for receiving, transferring, and guiding the small articles fed out from said parts feed ports of said parts feeder while postures of the small articles are kept maintained, an aligning unit, arranged midway along each of said guide pipe paths, for detecting directions of the small articles on the basis of the different shapes of the ends of the small articles when the small articles are sequentially fed from said parts feeder along a corresponding one of said guide pipe paths, and guiding each small article to a portion in a downstream of said guide pipe path with one end thereof leading, an outlet head having horizontally equidistant outlet paths each of which is arranged at a lower end portion of said each guide pipe path, has an opening at one end connected to a lower end of a corresponding one of said guide pipe paths to receive the small article, and has an opening at the other end for sequentially feeding out the small articles, an aligning plate having a plurality of reception grooves extending parallel to each other so that each of said reception grooves is coaxial with said opening at said other end of a corresponding one of said outlet paths of said outlet head, each of said reception grooves being formed to receive small articles so that a predetermined number of small articles are aligned in a line, a feed stop unit, arranged on said outlet head, for stopping feeding of the small articles from a corresponding one of the outlet paths of said outlet head when the predetermined amount of small articles are fed in a corresponding one of said reception grooves of said aligning plate, a matrix plate, horizontally arranged immediately below said aligning plate and having drop openings of a matrix form, said drop openings respectively corresponding to the small articles in said reception grooves and each of said drop openings having a matrix form to allow one small article in an upright posture to pass therethrough, a drop plate constituting a bottom wall of said aligning grooves of said aligning plate and horizontally movable toward said outlet head in a direction of said reception grooves, and a drop plate drive mechanism for horizontally moving said drop plate between a holding position on said matrix plate and a drop position offset from said matrix plate.

2. A small-article feed machine comprising:

an aligning unit with an inlet head having horizontally separated inlet paths each of which has an opening at one end thereof connected to an upstream portion of a corresponding guide pipe path to receive a small article and an opening at the other end thereof for sequentially discharging the small articles, a horizontal aligning plate arranged adjacent to said opening at said other end of said inlet path of said inlet head, passage openings formed in said aligning plate so as to shift from corresponding inlet paths in a direction of an array of said inlet paths, each of said passage openings being formed to allow one small article in a horizontal posture to pass therethrough, a slide head arranged adjacent to said inlet head on said aligning plate and slidable in the direction of the array of said inlet paths, and having inlet pockets each of which can guide one small article discharged from a corresponding one of said inlet paths onto said aligning plate when said each inlet pocket is aligned with the corresponding inlet path of said inlet head, detectors, arranged in said inlet pockets of said slide head, for detecting directions of small articles received into said inlet pockets and outputting detection signals, respectively, a slide head drive mechanism for moving said slide head in the direction of the array of said inlet paths and aligning each inlet pocket with one of a corresponding one of said inlet paths and a corresponding one of the passage openings of said aligning plate, a plurality of reception members, arranged immediately below said passage openings of said aligning plate, having reception holes tapered downward to receive small articles dropping through said passage openings, and connected to downstream portions of said guide pipe paths corresponding to lower ends of said reception holes, pins arranged inside said passage holes of said aligning plate at upper portions of said reception holes of said reception members, and horizontally extending in the direction of the array of said inlet paths, and a pin drive mechanism for driving each of said pins toward said inlet head or toward a side opposite thereto so as to cause the other end portion of a small article dropping through a through opening to abut against said each pin of said reception member paired with a corresponding one of said pockets on the basis of the detection signal from said detector of each of said pockets.

* * * * *